US006023018A

United States Patent [19]

Iwase

[11] Patent Number: 6,023,018

[45] Date of Patent: Feb. 8, 2000

[54] EFFECT ADDING APPARATUS AND METHOD

[75] Inventor: Hiroshi Iwase, Ome, Japan

[73] Assignee: Casio Computer Co., Ltd., Tokyo, Japan

[21] Appl. No.: 09/244,525

[22] Filed: Feb. 4, 1999

[30] Foreign Application Priority Data

Feb. 9, 1998 [JP] Japan .................................. 10-042900

[51] Int. Cl.[7] ................................ G10H 1/02; H03G 3/00

[52] U.S. Cl. .................................. 84/655; 84/662; 381/61

[58] Field of Search .............................. 84/617, 626–633, 84/655, 662–665, 682, 701–711; 381/61–65

[56] References Cited

U.S. PATENT DOCUMENTS 4,628,789 12/1986 Fujimori .
5,091,951 2/1992 Ida et al. .
5,257,313 10/1993 Fujishita et al. .

*Primary Examiner*—Stanley J. Witkowski
*Attorney, Agent, or Firm*—Frishauf, Holtz, Goodman, Langer & Chick, P.C.

[57] ABSTRACT

When a plurality of different effects are added to a plurality of musical notes at the same time, the plurality of musical notes are divided into a plurality of groups for musical notes, and the groups of musical note waveforms are delivered on a time divisional basis to an effect adding circuit, which adds the respective effects to the groups of musical note waveforms, accumulates at each waveform sampling period the musical note waveforms to which the respective effects have been added, and outputs a resulting musical note waveform. The sum of operation times required for adding the respective effects to the plurality of groups of musical note waveforms can exceed a sampling period depending on types of effect to be assigned. To avoid this situation, it is determined in advance whether the sum of the operation times required for adding the effects exceeds the sampling period. If so, addition of an effect to a musical note waveform where a depth of the effect is minimum is stopped.

10 Claims, 9 Drawing Sheets

EFFECT ADDING APPARATUS AND METHOD

TECHNICAL FIELD

The present invention relates to effect adding apparatus and method for use in electronic musical instruments.

BACKGROUND ART

Conventionally, effect adding apparatus are known which add various effects such as reverberation/delay to musical note waveforms fed from a sound source of an electronic musical instrument to produce effect sounds.

Recently, as the sound sources of such apparatus become multi-timbres oriented, the apparatus have come to include a digital signal processor (DSP) which processes at high speeds musical note waveforms of different timbres produced simultaneously by the sound source so that a plurality of different effects are added in common to the note waveforms or effects different in timbre are added to the note waveforms.

In such effect adding apparatus, the number of effect types to be added simultaneously is determined depending on the processing ability of the DSP. That is, in the conventional apparatus, effects assigned for each timbre cannot change during operation of the apparatus and are assigned as fixed, so that the sum of calculation times of the DSP required for processing the respective effects assigned to a respective one of note producing channels of the sound source can exceed one sampling period of the note waveform. In this case, real time effect addition cannot be performed and the number of different effects which can be added simultaneously is limited.

For example, when there can be a limitation that "chorus" and "distortion" effects cannot be added simultaneously, "chorus" cannot add to a string note while "distortion" to a guitar note being added, which limits a type of addition of the musical effect.

DISCLOSURE OF THE INVENTION

It is an object of the present invention to provide an effect adding apparatus capable of realizing various effects for the musical notes without any limitations.

According to one aspect of the present invention, there is provided an effect adding apparatus comprising:

- effect assigning means for assigning a plurality of effects to a corresponding input plurality of musical note waveforms received externally at a wave sampling period;
- time division control means for dividing the plurality of musical note waveforms into a plurality of groups of musical note waveforms for the corresponding plurality of effects and for outputting the groups of musical note waveforms on a time-divisional basis;
- assignment changing means for determining whether the sum of operation times required for adding the assigned plurality of effects to the plurality of groups of musical note waveforms has exceeded a waveform sampling period, and for changing types of the plurality of effects to be added by the effect assigning means when the changing means determines that the sum of the required operation times has exceeded the waveform sampling period;
- effect adding means for receiving the plurality of groups of musical note waveforms on a time divisional basis from the time division control means, and for adding the plurality of effects to the plurality of groups of musical note waveforms; and
- output means for accumulating the musical note waveforms to which the effect adding means has added the plurality of effects at the waveform sampling period, and for outputting a resulting musical note waveform.

According to another aspect of the present invention, there is also provided an effect adding method comprising the steps of:

- dividing a plurality of musical note waveforms received externally at a wave sampling period into a plurality of groups of musical note waveforms for the corresponding plurality of effects and outputting the groups of musical note waveforms on a time-divisional basis;
- determining whether the sum of operation times required for adding the assigned plurality of effects to said plurality of groups of musical note waveforms has exceeded one sampling period, and changing types of the plurality of effects to be assigned when the sum of the required operation times is determined to have exceeded the waveform sampling period;
- adding the assigned plurality of effects to the corresponding plurality of groups of musical note waveforms output on a time divisional basis by said outputting step; and
- accumulating the musical note waveforms to which said adding step has added the plurality of effects at the waveform sampling period, and outputting a resulting musical note waveform.

Therefore, according to the present invention, when the sum of the operation times required for adding the plurality of effect sounds to the plurality of groups of musical note waveforms to a musical note exceeds the waveform sampling period, the types of effects to be added to the musical note waveform is changed. Thus, the number of processable effect sound types increases seemingly, so that the number of effect sound types addable simultaneously to a musical note is not limited to thereby produce various effects.

BRIEF DESCRIPTION OF THE DRAWINGS

The above and other objects and features of the present invention will be easily understood by those skilled in the art from the following description of a preferred embodiment of the present invention when taken with the accompanying drawings.

In the drawings.

BEST MODE FOR CARRYING OUT THE INVENTION

An inventive effect adding apparatus is applicable to conventional computers, DTM (disk top music) apparatus or and various amusement apparatus which include a sound source. The embodiment of the inventive effect adding apparatus will be described below with respect to the accompanying drawings.

A. Composition of an Embodiment

Figure 1:
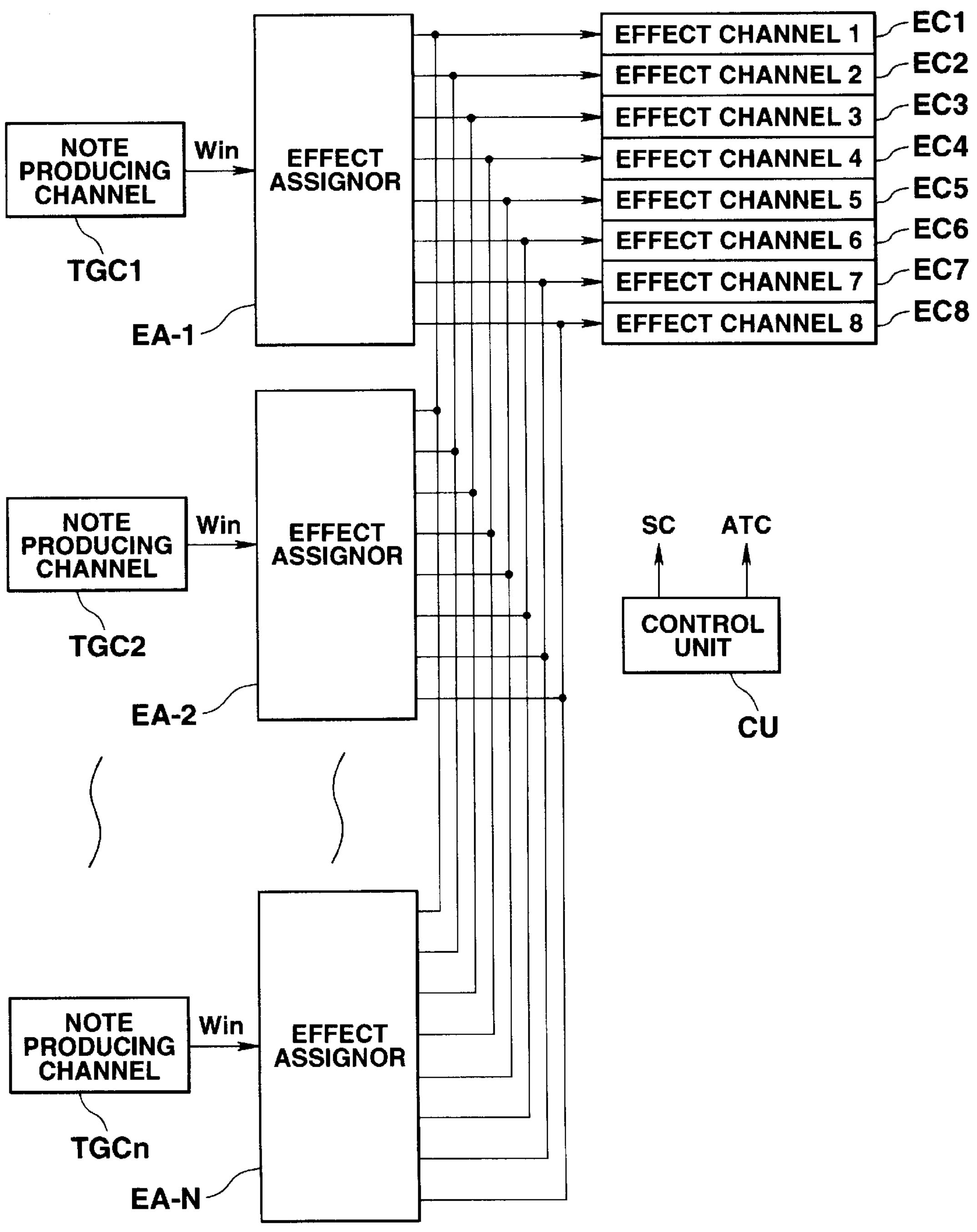
FIG. 1 is a block diagram of one embodiment of an effect adding apparatus according to the present invention.
Figure 2:
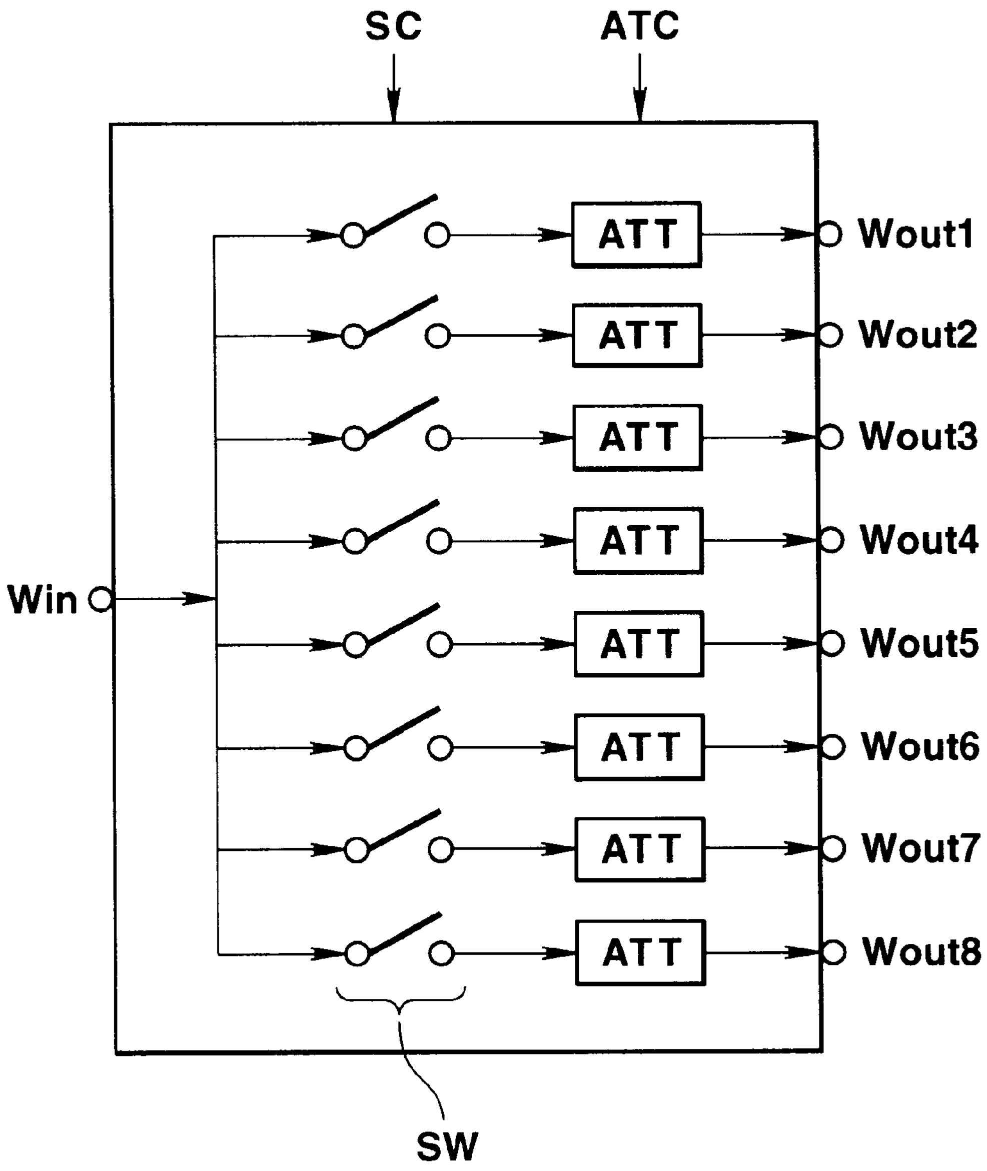
FIG. 2 illustrate the composition of an effect assignor.

FIG. 1 is a block diagram of an effect adding apparatus as an embodiment of the present invention. In FIG. 1, reference characters EA-1 to EA-N denote effect assignors provided for respective note producing channels TGC1–TGCn on the side of a sound source. As shown in FIG. 2, the effect assignors EA-1 to EA-n each include a plurality of switches SW selectively opened/closed depending on a control signal SC and a corresponding plurality of attenuators connected in series to the plurality of switches SW with quantities of attenuation in the respective attenuators ATT being controlled depending on a control signal ATC. Each effect assignor receives a musical note waveform Win from a corresponding note channel TGC and delivers it to output terminals Wout1–Wout8 depending on the control signals SC and ATC with the output terminals Wout1–Wout8 of each effect assignor being connected to a corresponding plurality of effect channels EC1–EC8.

The effect channels EC1–EC8, which are realized by a DSP, add respective independent effects to the musical note waveforms Win assigned via the respective effect assignors EN-1 to EN-n. Those effect channels EC1–EC8 add to the respective note waveforms different effect sounds in parallel independently on a time divisional basis in a sampling period of the waveform Win.

Figure 3:
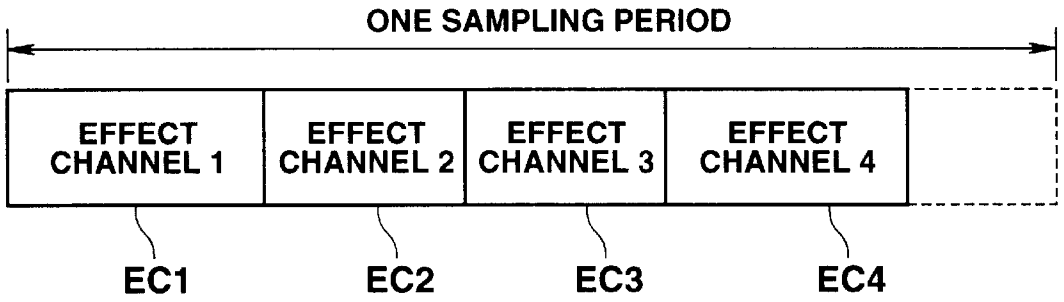
FIG. 3 illustrates an operating timing of effect channels.

Referring to FIG. 3, one example of an operation timing of each of the effect channel EC1–EC8 will be described. FIG. 3 illustrates that the effect channels EC1–EC8 (only EC1–EC4 are shown) are processed in parallel on a time divisional basis. As will be known in FIG. 3, the time periods which the respective effect channels EC1–EC8 occupy differ depending on the types of the effects to be added. If the sum of those occupying time periods go in one sampling period, the respective effects are added on the time-divisional basis in the effect channels EC1, EC2, EC3, EC4, . . .

Referring again to FIG. 1, the composition of the embodiment will be further described. In FIG. 1, a control unit CU delivers control signals SC and ATC to the respective effect assignors EA-1 to EA-n.

The control unit CU dynamically determines amounts of note waveforms Win assigned to the respective effect channels EC1–8 depending on the status of inputs from the respective note producing channels TGC-1–TGCn.

Figure 4:
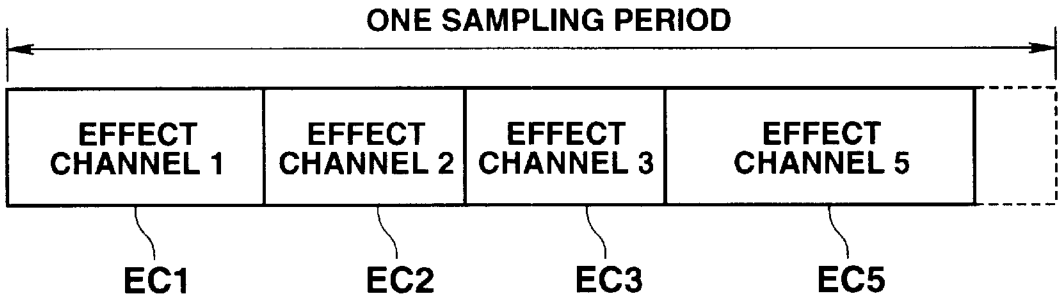
FIG. 4 illustrates dynamic assignment of effects performed by a control unit.
Figure 5:
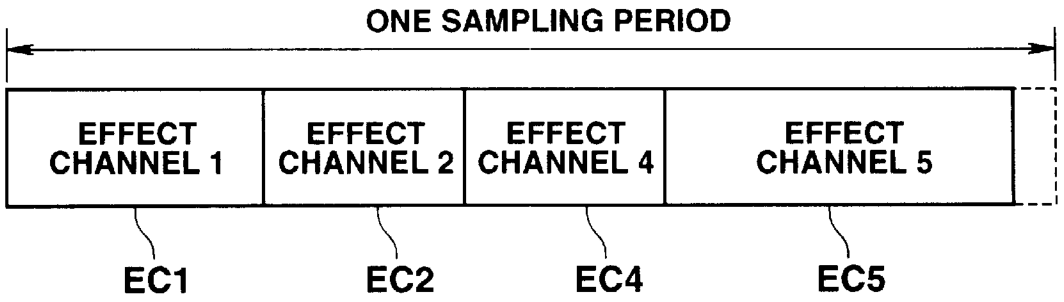
FIG. 5 illustrates another dynamic assignment of effects performed by the control unit.

Referring to FIGS. 4 and 5, dynamic assignment performed by the control unit CU will be described next. Assume, for example, that effect channels EC1–5 assigned to the respective timbres of the musical note producing channels TGC1–6 are set as follows:

Note producing channel TGC1 (piano) → effect channel EC 1

Note producing channel TGC2 (base) → effect channel EC 1

Note producing channel TGC3 (drum) → effect channel EC 2

Note producing channel TGC4 (strings) → effect channel EC 5

Note producing channel TGC5 (guitar) → effect channel EC 3

Note producing channel TGC6 (flute) → effect channel EC 4

The effect types assigned to the respective effect channels EC1–EC5 and the number of clocks required for executing those effects are as follows:

Effect channel EC1 → reverberation (300 clocks)

Effect channel EC2 → gate reverberation (200 clocks)

Effect channel EC3 → distortion (150 clocks)

Effect channel EC4 → delay (200 clocks)

Effect channel EC5 → chorus (300 clocks)

Assume now that the effect channels EC1–EC5 operate independently at the same time. In this case, the sum of their operation times is 1150 clocks. Further assume that the number of clocks operable for one sampling period is 1024 clocks. In this case, the sum of the occupying times exceeds the number of clocks of the waveform-sampling period, so that those effects cannot be added simultaneously.

When a flute note is not inputted from the note producing channel TGC6, the control unit CU stops assignment of operation to the effect channel EC4 (delay) and assigns operation to each of the effect channels EC1, EC2, EC3 and EC5.

In this case, as shown in FIG. 4, even when those effect channels EC1, EC2, EC3 and EC5 are operated simultaneously, the sum of their operation times is 950 clocks, which go in one sampling period (1024 clocks). In this case, “reverberation”, “gate reverberation”, “distortion” and “chorus” effects can be added simultaneously to those effect channels, respectively.

When no guitar note signal is input from the note producing channel TGC5, operation assignment to the effect channel EC3 (distortion) is stopped, and operation is assigned to each of the effect channels EC1, EC2, EC4 and EC5.

As shown in FIG. 5, in this case, even when those effect channels EC1, EC2, EC4 and EC5 are operated simultaneously, the sum of their operation times is 1000 clocks, which also go in one sampling period (1024 clocks), so that “reverberation”, “gate reverberation”, “delay” and “chorus” effects can be added simultaneously.

As described above, When the sum of the requiring operation times of the respective effects exceeds to be added exceeds one sampling period, the control unit CU dynamically determines the types of effects to be assigned, depending on the inputs from the respective note producing channels TGC 1–TGC n. This assignment is performed, for example, in accordance with the three predetermined conditions shown below.

1. An effect channel has an input,
2. An effect channel is assigned more note producing channels, and
3. An effect channel has received a note waveform Win of a higher signal level.

As a result, effect types to be used is seemingly increased by temporarily stopping the operation of effect channels which do not so frequently use a note waveform from a note producing channel or effect channels which receive a low input level from a note producing channel to thereby minimize an influence on the musical notes even when the effect assignment is stopped.

B. Operation

Referencing to FIGS. 6–11, the operation of the embodiment of the inventive effect adding apparatus will be described which is realized by executing a program based on a DPS algorithm.

The control unit CU executes at a sampling period a main routine which comprises a mixing routine, an effect assigning routine, an effect adding routine, and an output routine which will be described sequentially in this order. In this description, assume that there are effect channels EC1–EC8 corresponding to the musical note producing channels TGC1–16.

(1) Operation of Main Routine (outline)

Figure 6:
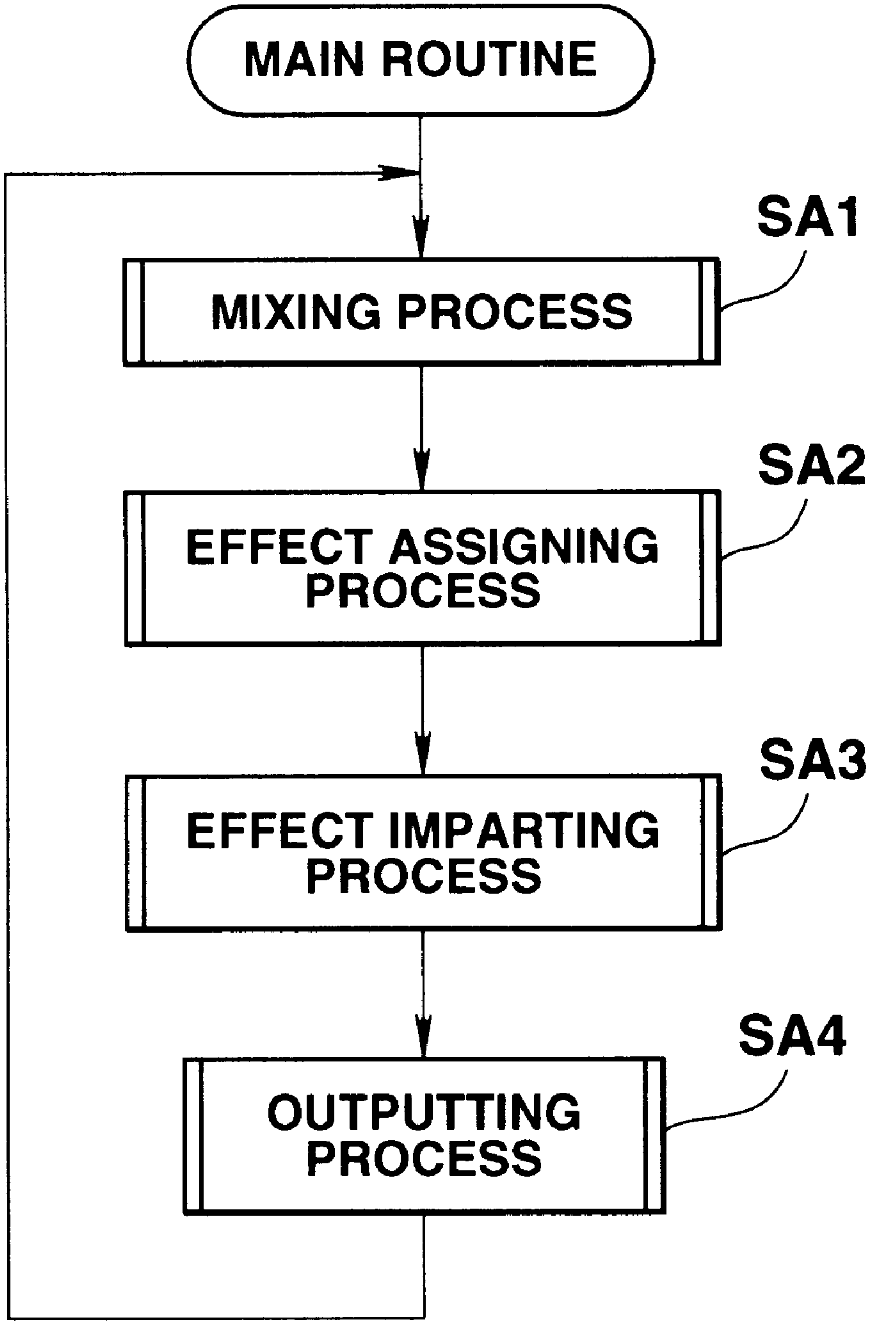
FIG. 6 is a flow chart of operation of a main routine.

When a power source is turned on, the control unit CU performs the main routine of FIG. 6 in each sampling period. Then, the control unit CP shifts its control to step SA1, where the control unit CU performs a mixing process in which note waveforms Win fed from musical note producing channels TGC1–16 on the side of a sound source are input to the respective effect channels EC1–8.

Then, the control unit CU shifts its control to step SA2, where the control unit CU performs an effect assigning process in which the control unit CU determines effect channels to be used depending on the inputs to the effect channels. Then, in step SA3, the control unit calculates the respective effects for the effect channels determined in the effect assigning process and adds the effects to the respective musical note waveforms. Then, the control unit shift its control to step SA4, where the control unit adds all the outputs from the respective effect channels to produce a final effect added musical note.

(2) Operation of Mixing Routine

Figure 7:
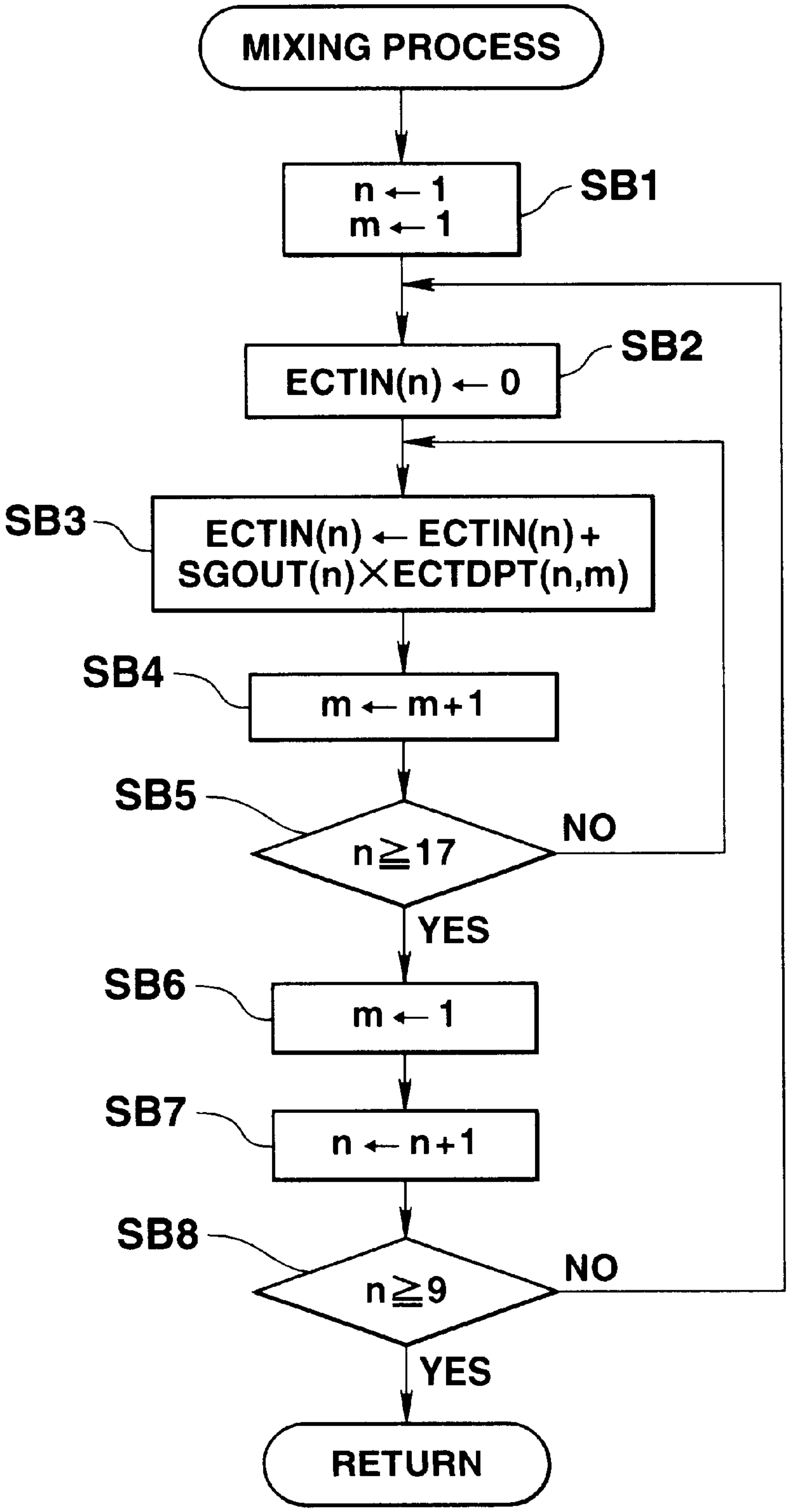
FIG. 7 is a flow chart of operation of a mixing routine.

Referring to FIG. 7, operation of the mixing routine will be next described. When this routine is executed in step SA1, the control unit CU shift its control to step SB1; where the control unit initially sets registers n and m in which effect channel number n and sound source side musical note producing channel number m are set, respectively.

In step SB2, the control unit CU resets at 0 a register ECTIN (n) which holds input waveform data for each of effect channels. Then in step SB3, the control unit stores in the register ECTIN (n) the product of a value in a register SGOUT (m) and a value in a register ECTDPT (n, m).

Stored in the register SGOUT (m) is data on a musical note waveform Win of a musical note production channel number m. Stored in the register ECTDPT (n, m) is data on an extent or depth of an effect of an effect channel number n to be added to the note waveform Win of a note channel number m.

That is, stored in the register ECTDPT (n, m) is a value corresponding to a control signal ATC which controls a quantity of attenuation in an attenuator ATT (FIG. 2). This value is a parameter preset optionally depending on a type of an effect specified by the user.

In step SB4, the control unit CU increments the musical note channel number m by one. Then, in step SB5, the control unit CU determines whether the incremented musical note channel number m is larger than "17" or whether the sum of the values of the inputs to the effect channel EC1 has been calculated by accumulating the results of multiplication of degree of an effect of the effect channel EC1 to be added, by the respective musical note waveform data Win of all the musical note producing channels TGC1–16.

If not, the result of the determination in step SB4 is NO. Thus, the control unit returns its control to step SB3, where the control unit iterates steps SB3–SB5 until accumulation for all the musical note producing channels is completed. When the control unit CU has then calculated a whole waveform value input to the effect channel EC1, the result of the determination in step SB5 becomes "YES".

The control unit then shifts its control to step SB6, where the control unit resets at "1" the musical note producing channel number m. Then, in step SB7, the control unit increments the effect channel number n by one. In step SB8, the control unit determines whether the incremented effect channel number n is larger than 9 or whether input waveform values to all the effect channels EC1–8 have been calculated.

If not, the result of the determination in step SB8 becomes NO, so that the control unit returns its control to step SB2. Then, the control unit iterates steps SB2–SB7 until the input waveform values for all the effect channels EC1–8 are calculated, at which time the result of the determination becomes YES and the control unit terminates this routine.

As described above, in the mixing routine, the control unit multiplies degrees of effects to be added in respective effect channels by the respective musical note waveform data Win of all the musical note producing channels TGC1–16, and adds them all to obtain waveform values input to the respective effect channels EC1–8.

(3) Operation of Effect Sound Assigning Routine

Figure 8:
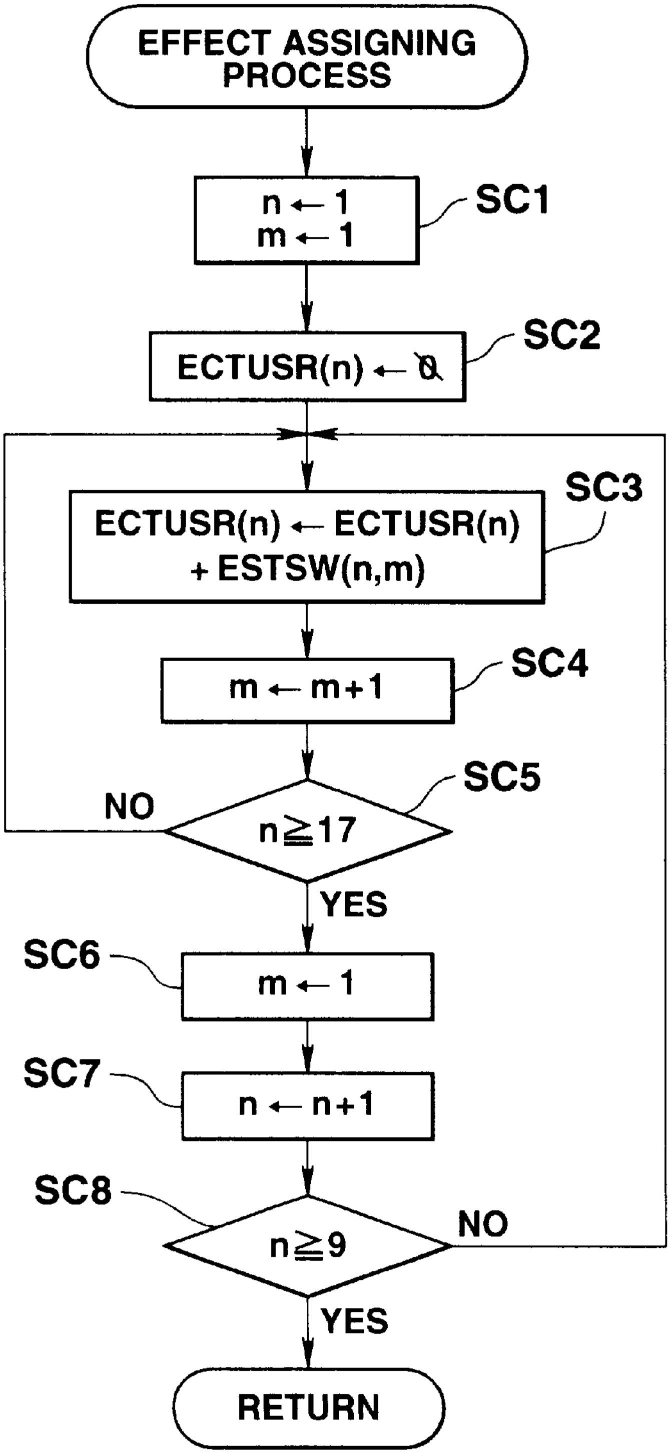
FIG. 8 is a flow chart of operation of an effect assigning routine.
Figure 9:
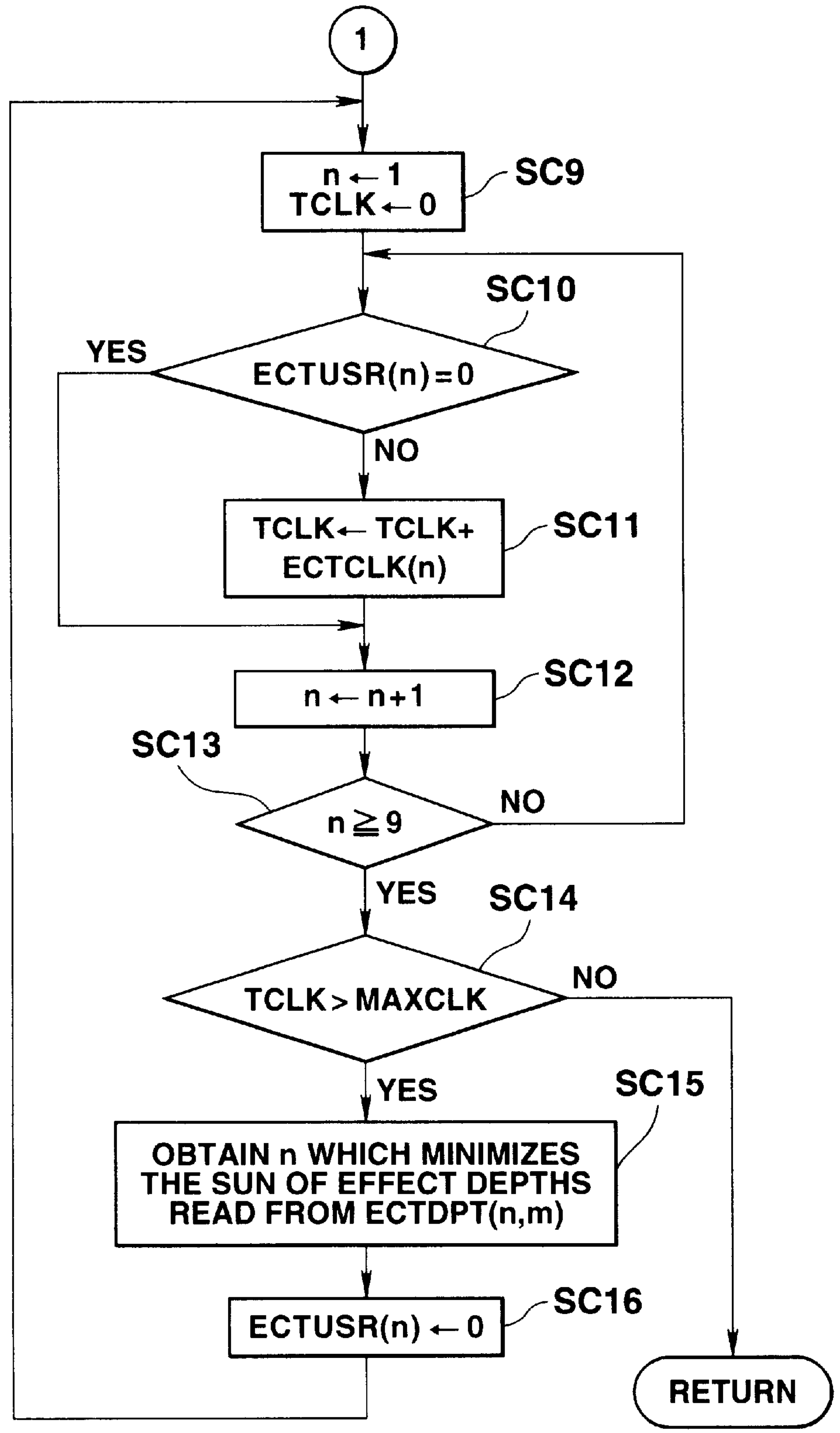
FIG. 9 is a flow chart of operation of another effect assigning routine.

Referring to FIGS. 8 and 9, the operation of an effect assigning routine will be next described. When the input waveform values of the musical notes for the respective effect channels EC1–8 are determined, the control unit executes an effect assigning routine of FIG. 8 in step SA2, that is, shifts its control to step SC1, where the control unit sets at initial values those of the effect channel number n and musical note producing channel number m stored in the registers n and m, respectively. Then, in step SC2, the control unit resets at 0 a register ECTUSR (n), which holds the number of musical note producing channels which use an effect channel number n.

In step SC3–SC8, the control unit CU then estimates the number of musical note producing channels used for each of the effect channels EC1–8 based on the value in the register ECTSW (n, m).

More specifically, in step SC3 the control unit reads out from the register ECTSW (n, m) a switch value corresponding to a control signal SC which turns on/off the switches SW (FIG. 2) (values "0" and "1" represent that the switches are off/on, respectively), and adds it to a register ECTUSR (n). The switch value stored in the register ECTSW (n, m) is a parameter preset optionally depending on a type of an effect specified by the user.

Then, in step SC4 the control unit increments the musical note producing channel number m, and in step SC5 it determines whether switch values for all the musical note producing channels have been read out from the register ECTSW (n, m) . If not, the result of the determination in step SC4 becomes NO and the control unit returns its control to step SC3 and then iterates processing in steps SC3–SC5 until the switch values for all the musical note producing channels are read out to accumulate the switch values in the register ECTUSR (n), at which time the result of the determination becomes "YES".

The control unit CU then shift its control to step SC6, where the control unit resets at "1" the musical note producing channel number m, and then instep SC7 it increments the effect channel number n by one. In step SC8, the control unit determines whether the number of musical note producing channels used for each of all the effect channels EC1–8 has been estimated. If not, the result of the determination becomes "NO", and the control unit returns its control to step SC3. When control unit has calculated the number of musical note producing channels to be used for the respective effect channels EC1–8, the result of the determination becomes "YES", and the control unit shift its control to step SC9 of FIG. 9.

Then, after steps SC9–SC13, the control unit calculates the number of processing clocks required for one sampling period.

First, in step SC9, the control unit resets at 1 the effect channel number n, and resets at 0 the value in the register TCLK in which the accumulated clock value is stored. Then, in step SC10, the control unit determines whether the number of musical note producing channels read out from the register ECTUSR (n) in correspondence to the effect channel number n is 0 or whether there is any musical note producing channel which uses the effect channel number n.

If so, the value of the register ECTUSR (n) is not 0. Thus, the result of the determination becomes "NO", and the control unit then shift its control to step SC11, where the control unit reads out the number of processing clocks required for one sampling period stored in the register ECTCLK (n), adds the read-out number of processing clocks in the register TCLK, and then shifts its control to step SC12.

The number of processing clocks stored in the register ECTCLK (n) is prescribed in correspondence to the effect types assigned to the effect channel number n.

When there are no musical note producing channels which use the effect channel number n, the value in the register ECTUSR (n) is 0. Thus, the result of the determination becomes "YES" in step SC10, and the control unit then shifts its control to step SC12, where the control unit increments the effect channel number n by one. Then, in step SC13, the control unit CU determines whether the incremented effect channel number n is larger than 9, that is, whether the number of processing clocks for all the effect channels EC1–8 has been accumulated. If not, the result of the determination becomes "NO" in step SC13, and the control unit returns its control to step SC10 to iterate processing in steps SC10–SC12. When the accumulated clock value is obtained, the result of the determination becomes "YES" in step SC13.

Then, the control unit CU shift its control to step SC14, where the control unit determines whether the accumulated clock value has exceeded a maximum number of clocks stored in a register MAXCLK operable for one sampling period in the DSP, for example, 1024 clocks in the above described example, (FIGS. 4 and 5).

That is, the control unit determines whether the sum of the operating times occupied by the respective independently and simultaneously operating effect channels EC (accumulated clock value) has exceeded the number of clocks operable or calculable per one sampling period. If not, the result of the determination becomes "NO" in step SC14. In this case, since all the effect channels used can simultaneously operate separately, the control unit terminates the present routine without doing any other things.

If the sum of the occupying times exceeds the number of clocks operable per one sampling period, the result of the determination in step SC14 becomes "YES". The control unit then shift its control to step SC15, where the control unit reads out degrees of effects to be added to the respective effect channel numbers n from the register ECTDPT (n, m) in order of musical note producing channel number n, calculates their sum, and obtains an effect channel number n which takes a minimum value of the sum. That is, the control unit retrieves an effect channel number n in which when the effect exhibiting operation is stopped an influence from the effect is minimized.

In step SC16, the control unit CU sets 0 in the register ECTUSR (n) corresponding to the obtained effect channel number n, stops the use of the corresponding effect channel ECn, and then returns its control to step SC9. The control unit then iterates the processing in steps SC9–SC16 until the accumulated clock value goes in the number of clocks operable per one sampling period. That is, dynamic effect channel assignment is performed in accordance with the above-mentioned conditions.

(4) Operation of Effect Sound Adding Routine

Figure 10:
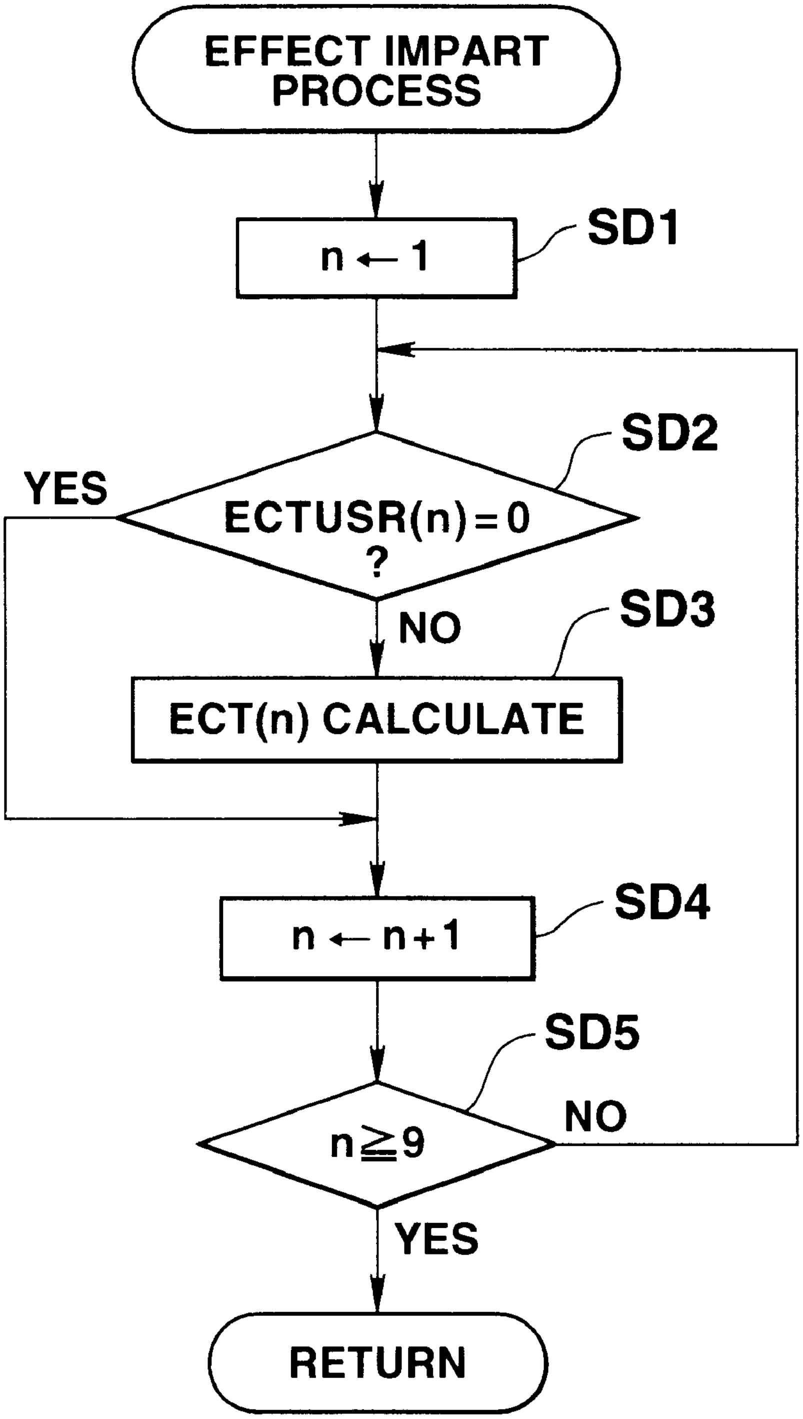
FIG. 10 is a flow chart of operation of an effect adding routine.

Next, referring to FIG. 10, the operation of an effect adding routine will be described. When a plurality of effect channels which operate simultaneously and independently are fixed by the effect assigning routine, the control unit CU executes this routine in step SA3 (FIG. 6). That is, the control unit then shifts its control to step SD1 of FIG. 10, where the control unit sets at 1 the effect channel number n, and determines in step SD2 whether a register ECTUSR (n) corresponding to the effect channel number n is at 0 or whether the effect channel is an unused one.

If so, the result of the determination becomes "YES", and the control unit shift its control to step SD4. If the effect channel is used, the result of the determination becomes "NO". Thus, the control unit CU shift its control to step SD3, where the control unit calculates an effect type ECT (n) assigned to that effect channel, and stores the result of the calculation in register ECTOUT (n).

Then, the control unit CU shifts its control to step SD4, where the control unit increments the effect channel number n by one. Then, in step SD5, the control unit determines whether the incremented effect channel number n is larger than 9, that is, calculation of reverberation, delay, etc., of the effect types ECT (n) corresponding to all the effect channels EC1–8 has been completed.

If not, the result of the determination becomes "NO". Thus, the control unit returns its control to step SD2 to iterate the processing in steps SD2–SD4. When the calculation of the effect types ECT (n) corresponding to all the effect channels EC1–EC8 has been completed, the result of the determination becomes "YES", and the control unit then terminates this routine.

(5) Operation of Outputting Routine

Figure 11:
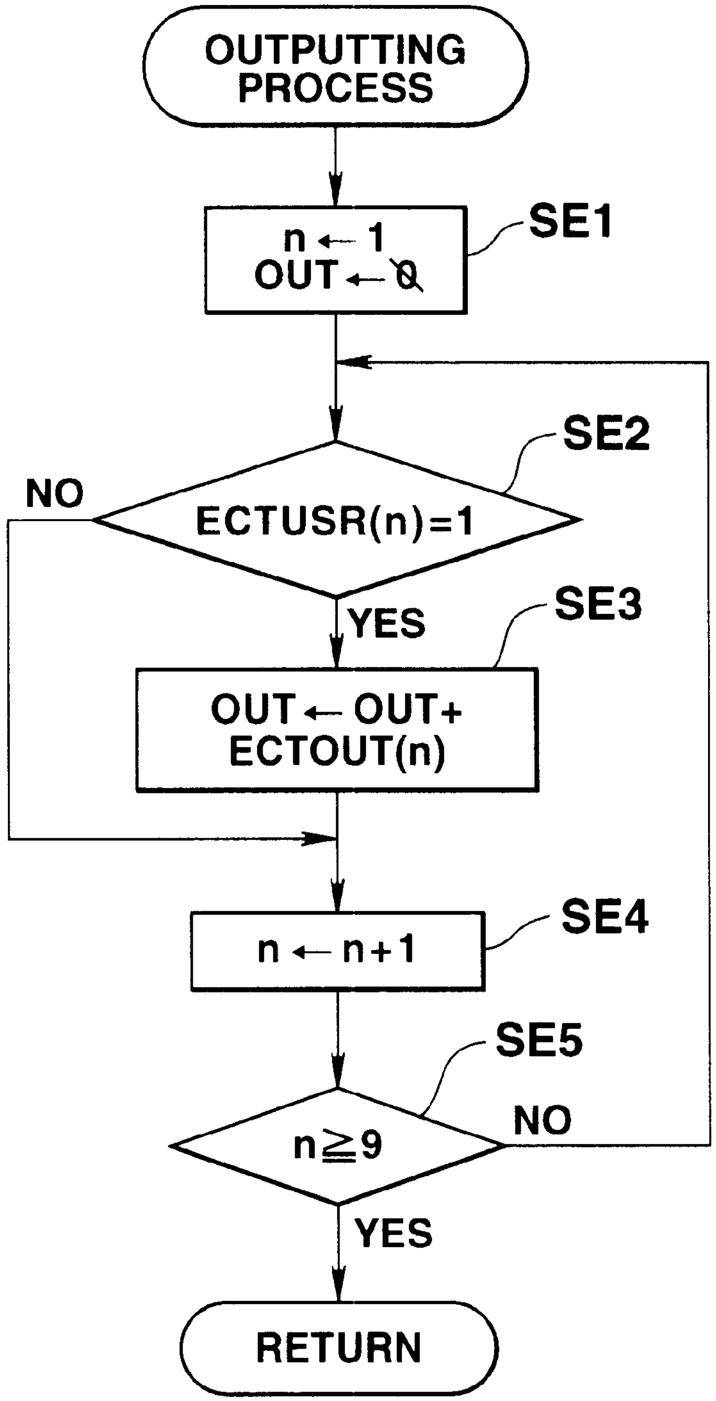
FIG. 11 is a flow chart of operation of an outputting routine.

Then, referring to FIG. 11, the operation of the outputting routine will be described. When this routine is executed in step SA4 (FIG. 6), the control unit CU shifts its control to step SE1 of FIG. 11, where the control unit sets at 1 an effect channel number n stored in the register n, and resets at 0 a register OUT which holds an added effect output value.

Then, in step SE2, the control unit CU determines whether the value of a register ECTUSR (n) corresponding to the effect channel number n is 1 or whether the channel of interest is used. If so, the control unit shifts its control to step SE3 where the control unit reads out the result of the calculation stored in a register ECTOUT (n) and adds it to data in the register OUT in the effect adding routine.

When the effect channel is an unused one, the result of the determination in step SE2 becomes NO, and the control unit shifts its control to step SE4 where the control unit increments the effect channel number n by one. Then, in step SE5, the control unit determines whether the incremented effect channel number n is larger than 9 or whether the results of calculation of the effect types for all the effect channels EC1–18 have been accumulated.

If not, the result of the determination becomes NO. The control unit then returns its control to step SE2, where the control unit iterates the processing in steps SE2–SE5 until the results of the calculation for all the effect channels EC1–EC8 are completely accumulated. Then, a musical effect based on the accumulation of the results of calculation of the effect types is stored in the register OUT, the results of the determination in step SE5 becomes YES and this routine is completed.

As described above, according to the present embodiment, when the sum of the occupying times of the effects required for the effect assigning process exceeds one sampling period, the number of effect types to be added is dynamically adjusted depending on the status of the respective inputs from the musical note producing channels TGC1-n. Thus, the number of effects types to be added seemingly increases, and as a result, various effects can be added to the musical notes limitlessly.

In the above embodiment, the effect types to be used are changed depending on the status of the respective inputs from the musical note producing channels TGC1-n. In this case, if the musical note is abruptly muted, discontinuity in the waveform may appear at that instant to produce noise or an unnatural effect sound.

In order to avoid this situation, the volume of an effect corresponding to an effect type whose production is to be stopped is gradually reduced while the volume of an effect corresponding to an effect type to be added newly is gradually increased. That is, a so-called cross-fading process may be performed.

While in the embodiment the effect types to be assigned are selected in consideration of the predetermined conditions, an alternative effect of the same effect type in which the number of processing clocks is small may be instead assigned to an effect channel which receives a low input level or an effect channel which uses a small number of musical note producing channels.

If the alternative effect is a one such as filters or reverberations, which requires a plurality of stages of convolutions, a method of reducing the number of delay stages/operation bits may be employed. In this case, although the accuracy of the calculation is scarified, more types of effects can be added simultaneously.

While in the embodiment the effect types to be assigned are selected in accordance with the predetermined conditions, for example, including the frequency of use of an effect channel, effects may be additionally assigned dynamically in consideration of the frequencies of use of the musical note producing channels. More particularly, by controlling the sound source and the effect adding device in a cooperative manner, that is, by assigning musical note producing channels and effect channels simultaneously, efficient assignment of effects is achieved without any loss time to thereby achieve addition of many more various effects.

What is claimed is:

1. An effect adding apparatus comprising:

effect assigning means for assigning a plurality of effects to a corresponding input plurality of musical note waveforms received externally at a wave sampling period;

time division control means for dividing the plurality of musical note waveforms into a plurality of groups of musical note waveforms for the corresponding plurality of effects and for outputting the groups of musical note waveforms on a time-divisional basis;

assignment changing means for determining whether the sum of operation times required for adding the assigned plurality of effects to said plurality of groups of musical note waveforms has exceeded a waveform sampling period, and for changing types of the plurality of effects to be added by said effect assigning means when said changing means determines that the sum of the required operation times has exceeded the waveform sampling period;

effect adding means for receiving the plurality of groups of musical note waveforms on a time divisional basis from said time division control means, and for adding the plurality of effects to the plurality of groups of musical note waveforms; and output means for accumulating the musical note waveforms to which said effect adding means has added the plurality of effects at the waveform sampling period, and for outputting a resulting musical note waveform.

2. The effect adding apparatus according to claim 1, wherein said time division control means accumulates the divided plurality of groups of musical note waveforms at each waveform sampling period, and for outputting the accumulated musical note waveforms on a time divisional basis.

3. The effect adding apparatus according to claim 1, wherein said time division control means comprises multiplying means for multiplying data on each of the musical note waveforms of each of the plurality of groups by a coefficient which represents a depth of an effect to be added to a respective one of the musical note waveforms of that group.

4. The effect adding apparatus according to claim 1, wherein said assignment changing means specifies at least one of the musical note waveforms of a particular one of the plurality of groups only when said assignment changing means determines that the sum of the required operation times which the effects occupy exceeds the waveform sampling period, and for stopping addition of the effect to the specified at least one musical note waveform.

5. The effect adding apparatus according to claim 4, wherein said assignment changing means specifies a particular one of the musical note waveforms of that group to which said assignment changing means adds an effect whose depth is minimum.

6. An effect adding method comprising the steps of:

dividing a plurality of musical note waveforms received externally at a wave sampling period into a plurality of groups of musical note waveforms for the corresponding plurality of effects and outputting the groups of musical note waveforms on a time-divisional basis;

determining whether the sum of operation times required for adding the assigned plurality of effects to said plurality of groups of musical note waveforms has exceeded one sampling period, and changing types of the plurality of effects to be assigned when the sum of the required operation times is determined to have exceeded the waveform sampling period;

adding the assigned plurality of effects to the corresponding plurality of groups of musical note waveforms output on a time divisional basis by said outputting step; and accumulating the musical note waveforms to which said adding step has added the plurality of effects at the waveform sampling period, and outputting a resulting musical note waveform.

7. The effect adding method according to claim 6, wherein said dividing and outputting steps accumulate the divided plurality of groups of musical note waveforms at each waveform sampling period, and output the accumulated musical note waveforms on a time divisional basis.

8. The effect adding method according to claim 6, wherein said dividing and outputting steps comprise a step of multiplying data on each of the musical note waveforms of each of the groups by a coefficient which represents a depth of an effect to be added to a respective one of the musical note waveforms of that group.

9. The effect adding method according to claim 6, wherein said changing step specifies at least one musical note of the musical note waveforms of a particular one of the plurality of groups only when said changing step determines that the sum of the required operation times exceeds the waveform sampling period, and stops addition of the effect to the specified at least musical note waveform.

10. The effect adding method according to claim 9, wherein said assignment changing means specifies a particular one of the musical note waveforms of that group to which an effect is added whose depth is minimum.

* * * * *